United States Patent [19]
Love et al.

[11] Patent Number: 5,203,867
[45] Date of Patent: * Apr. 20, 1993

[54] METHOD FOR GENERATING POWER-UP PULSE

[75] Inventors: Andrew M. Love, Stafford, Tex.; Roger D. Norwood, Sunnyvale, Calif.

[73] Assignee: Texas Instruments Incorporated, Dallas, Tex.

[*] Notice: The portion of the term of this patent subsequent to Jul. 9, 2008 has been disclaimed.

[21] Appl. No.: 717,139

[22] Filed: Jun. 18, 1991

Related U.S. Application Data

[63] Continuation of Ser. No. 415,944, Oct. 2, 1989, Pat. No. 5,030,845.

[51] Int. Cl.$^5$ ............................................. H03K 17/22
[52] U.S. Cl. .................... 307/272.2; 307/592; 307/594
[58] Field of Search .............. 307/272.3, 592, 594, 307/597, 603, 272.1, 200.1, 362

[56] References Cited

U.S. PATENT DOCUMENTS 5,030,845  7/1991  Love et al. .................. 307/272.3

*Primary Examiner*—David Hudspeth
*Attorney, Agent, or Firm*—Theodore D. Lindgren; Leo N. Heiting; Richard L. Donaldson

[57] ABSTRACT

In one embodiment, the pulse-generating circuit includes a triggering field-effect device having a source-drain path connected between a voltage supply and an internal node and having a gate connected to a source of reference potential, a capacitor connected between the voltage supply and the output node, and a detector field-effect device having a source-drain path connected between the output node and the source of reference potential and having a gate connected to the internal node. An optional load device, an optional pull-down device, an optional second capacitor, a optional string of diode-connected devices, and an optional feedback device may be included. Device channel lengths are specified for proper operation. In one embodiment, the circuit includes only a detector field-effect transistor and a load field-effect transistor, the detector transistor having a channel length substantially longer than the channel length of the load transistor.

The circuit described and claimed herein is immune to the unpredictable behavior of static logic gates during the initial part of the power-on transient when the supply voltage is less than the threshold voltage of the integrated circuit transistors. In particular, the circuit does not have a node connected to both a static pull-up path and a static pull-down path, both of which are on at the same time, forming a linear circuit.

19 Claims, 1 Drawing Sheet

METHOD FOR GENERATING POWER-UP PULSE

This is a continuation of application Ser. No. 07/415,944, filed Oct. 2, 1989 now U.S. Pat. No. 5,030,845.

BACKGROUND OF THE INVENTION

This invention relates to a circuit for generating a pulse output signal each time that an integrated circuit is energized by a source of power.

In many cases, an integrated circuit device includes logic or other circuits that must be preset or inhibited while the device is being powered up to an external power supply. A "power-up" circuit is used to generate an internal signal for presetting or inhibiting logic or other circuits and may also be used for other purposes such as triggering on-chip self-test functions. The power-up circuit must reliably detect application of voltage to the chip, whether energized rapidly or slowly.

Applications of the external power supply to a simple RC differentiating circuit might be used to perform the power-up signalling function. However, in many applications, the Vdd rise time may be on the order of milliseconds or even seconds, causing a differentiating circuit to fail to generate a pulse signal of sufficient magnitude.

The resistor of an RC differentiating circuit may be replaced by an N-channel field-effect transistor 2 switched by a Vdd trigger circuit TR of power-up circuit 3 of integrated circuit 4, as shown in FIG. 1. The trigger circuit TR that triggers the N-channel field-effect transistor 2 may be designed so that its output is low when the supply voltage Vdd is below some pre-set triggering threshold Vtr, then goes high when Vdd rises above that threshold, providing a pulse Vout at the output of the power-up circuit 3, as indicated in FIG. 2. Designing such a trigger circuit TR poses some special problems, particularly when the circuit 3 is being designed for use in a dynamic-random-access-memory (DRAM) for which the process flow is under development. Those problems result from the fact that circuit element parameters will change as the processing steps are modified during the development cycle. In particular, the trigger circuit's threshold voltage Vtr will generally vary as the circuit parameters change with process variations. Therefore, a linear trigger circuit TR must be designed for a low triggering threshold voltage Vtr because linear circuit characteristics are prone to wide variations as the process changes, requiring wide safety margins to ensure that the circuit 3 output is high at normal operating levels for supply voltage Vdd. Typical linear trigger circuits TR draw power at all times, requiring special techniques to avoid unacceptably large standby currents, particularly where such linear circuits TR have both pull-up and pull-down current paths turned on at the same time.

It is particularly difficult to design a trigger circuit TR that performs its intended function during the first part of the power-up transient when the supply voltage Vdd is below the threshold voltage Vt of the transistors in the circuit 3. While the transistors are not turned "on" in the usual sense, application of a subthreshold voltage Vdd causes normally insignificant subthreshold currents to flow from drain to source. These subthreshold currents can cause unreliable circuit 3 operation if they are not anticipated. However, the circuit 3 described herein shows how such subthreshold currents may be used to advantage. In particular, subthreshold currents may be controlled by channel length because subthreshold current has greater magnitude in short-channel devices than in long-channel devices.

When the gate-to-source voltage of a field-effect capacitor is smaller than the threshold voltage Vt, most of the gate capacitance occurs between the gate and the substrate. When the capacitor is charged to a larger voltage, most of the capacitance occurs between the gate and the source/drain, and the gate-to-substrate capacitance is insignificant. Therefore, the smaller gate-to-substrate capacitance generally dominates if the supply voltage Vdd is below the threshold voltage Vt.

Because of the above phenomena, ordinary design techniques do not apply during the initial part of the power-up switching transient in which the supply voltage Vdd is less than the threshold voltage Vt. However, the behavior of a power-up detector is critical during the initial part of the power-up transient. The behavior is particularly critical where the power-up trigger circuit TR behaves as a one-sided latch. That is, the voltage Vout at output terminal may go high and fall to ground only once while the supply voltage Vdd is high. The output voltage Vout cannot go high again until the supply voltage Vdd falls to zero and rises again, and then only if all capacitors discharge while the supply voltage Vdd is low.

Subthreshold conduction in certain elements of prior-art circuits 3 may cause the voltage Vout at the output terminal to go low when supply voltage Vdd is less than threshold voltage Vt. If this happens, the circuit might not be able to recover. Some prior-art circuits have been designed with feedback to hold the output terminal low once it has gone low. In these circuits 3, the feedback path may turn on even before supply voltage Vdd reaches threshold voltage Vt if the voltage across certain elements goes high prematurely. This makes it critically important for the power-up trigger circuit TR to be absolutely reliable, even in the range where usual design techniques do not apply.

In particular, the outputs of usual logic gates are unpredictable during the part of the power-up transient in which supply voltage Vdd is less than the threshold voltage Vt. Since normal gates have both pull-up and pull-down capabilities, their outputs may go either high or low when supply voltage Vdd is less than threshold voltage Vt, and the states on the gate inputs may not control the outputs. Therefore, it is especially risky to use common logic gates for Vdd detectors.

One of the problems with use of such common logic gates is that both pull-up and pull-down gates may be caused to be on at the same time, forming a linear circuit of the type mentioned above. Therefore, a logic gate may have the same problems as a linear circuit during the power-up transient.

Another problem is an unacceptable amount of standby current drawn by a linear power-up circuit 3. Use of a detector circuit with a dynamic pull-up rather than a static pull-up to solve this problem has been shown to provide an unreliable signal on second start-up occurring shortly after a first start-up. Use of static inverters in feedback paths has also resulted in unpredictable behavior when supply voltage Vdd is below threshold voltage Vt because the feedback path turns on prematurely, causing the trigger circuit TR to fail.

Examples of prior-art circuits 3 for generating a "power-up" pulse are illustrated in U.S. Pat. No. 4,716,322 and in U.S. patent application Ser. No.

07/172,532 filed Mar. 24, 1988 (now U.S. Pat. No. 4,888,498), both of which are assigned to Texas Instruments Incorporated.

In the circuit of U.S. patent application Ser. No. 07/172,532, a P-channel capacitor assisted by a P-channel pull-up transistor acts to cause the output signal of the power-up circuit 3 go high. A linear circuit comprising a P-channel transistor and a string of N-channel transistors forms the trigger circuit TR. As the supply voltage Vdd rises, the voltage output rises with Vdd until the trigger circuit output rises to threshold voltage Vt. After that, the output voltage Vout is pulled low by the N-channel pull-down transistor gated by the trigger circuit output. When the output voltage Vout goes low, the N-channel transistor string is turned off to save power and a P-channel feedback device is turned on to hold the output high. Because the trigger circuit TR is a linear circuit, its threshold voltage Vout is prone to be sensitive to process variations. In addition, the N-channel device that turns off the N-channel transistor string, in combination with the P-channel feedback device, forms a circuit that resembles a static inverter, which may perform unpredictability when the supply voltage Vdd is less than the threshold voltage Vt. Another problem is that noise in the supply voltage Vdd, caused by an external clock cycling, may tend to turn off the trigger circuit TR prematurely.

SUMMARY OF THE INVENTION

The circuit of this invention overcomes the problems described above by eliminating the necessity for a feedback path that has both a static pull-up and a static pull-down on any node. The circuit described and claimed herein is immune to the unpredictable behavior of static logic gates during the part of the power-up transient when the supply voltage Vdd is less than the threshold voltage Vt. In addition, the circuit does not have a node connected to both a static pull-up path and a static pull-down path, both of which are on at the same time, forming a linear circuit.

In one embodiment, the circuit includes a triggering field-effect device having a source-drain path connected between a voltage supply and an internal node and having a gate connected to a source of reference potential, a capacitor connected between the voltage supply and the output node, and a detector field-effect device having a source-drain path connected between the output node and the source of reference potential and having a gate connected to the internal node. An optional load device, an optional pull-down device, an optional second capacitor, an optional string of diode-connected devices, and an optional feedback device may be included.

BRIEF DESCRIPTION OF THE DRAWING

The novel features of this invention are set forth in the appended claims. The invention, its features, and its advantages are described below in conjunction with the following drawing:

DETAILED DESCRIPTION OF SPECIFIC EMBODIMENTS

Figure 1:
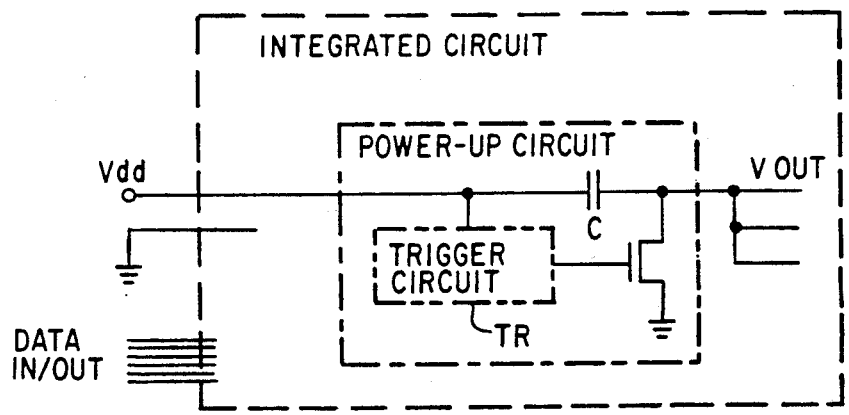
FIG. 1 is a primarily block diagram circuit illustrating in general the usage of power-up circuits, including trigger circuits.
Figure 2:
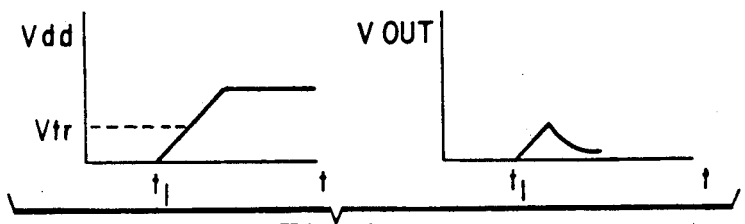
FIG. 2 is a generalized illustration of time-varying input and output voltages of power-up circuits.
Figure 3:
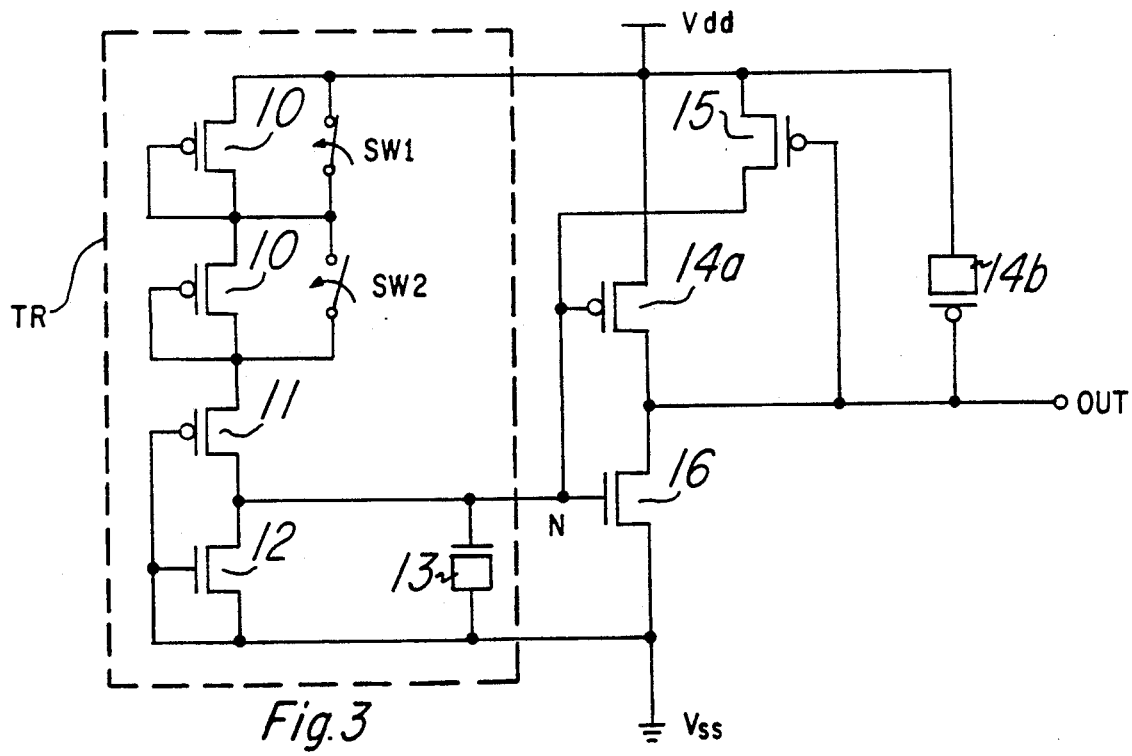
FIG. 3 is a schematic diagram of one embodiment of the circuit of this invention.

Referring to FIG. 3, a circuit that provides a power-up pulse in response to application of voltage from a power supply is shown.

The circuit includes an optional string of diode-connected field-effect devices 10 pulling up on the internal node N. P-channel devices 10 may, for example, have a channel width-to-length ratio of approximately 3-to-2. The channel length of P-channel devices 10, and all other devices in this description unless otherwise noted, should be substantially longer (at least 50 percent longer) than the minimum field-effect-channel length allowed by the pertinent integrated circuit fabrication technology. One end of the series-connected source-drain paths of P-channel devices 10 is connected to voltage supply Vdd and the other end is connected to internal node N via the source-drain path of P-channel triggering field-effect transistor 11. The gates or control electrodes of P-channel devices 10 are connected to the source-drain paths in diode fashion. P-channel devices 10 may be formed on the chip during early processing steps, then selectively bypassed by metal conductors SW1 and SW2 deposited during the latter stages of production if some or all of the devices 10 are not required during adjustment of the Vcc pulse threshold. As is well-known, diode-connected N-channel devices may be used rather than diode-connected P-channel devices 10, the gate connections being made at the upper ends of the source-drain paths of each N-channel device. Devices 10 and 11 are optional parts of trigger circuit TR, which is connected between first voltage supply Vdd and internal node N.

Triggering field-effect device 11 may also have a channel width-to-length ratio of approximately 3-to-2 and the gate or control electrode of triggering device 11 is connected to a second voltage supply Vss, indicated as ground or reference potential.

The source-drain path of optional N-channel pull-down device 12 is connected between internal node N and second voltage supply Vss. Pull-down field-effect device 12 may have a channel width-to-length ratio of approximately 20-to-1 and the gate or control electrode of pull-down device 12 is connected to second voltage supply Vss. The channel length of this device 12 is ideally the minimum used for fabrication of the entire integrated circuit, but may be substantially less (at least 20 percent less) than the channel length of triggering device 11. Device 12 is an optional part of trigger circuit TR.

An optional depletion mode N-channel capacitor 13 is connected between internal node N and second voltage supply Vss. Capacitor 13 may be formed from a field-effect transistor with source and drain connected to second voltage supply Vss and gate or control electrode connected to internal node N. The channel area of capacitor 13 may be approximately 5 times the area of pull-down device 12. Capacitor 13 may be implemented in any form, including N-channel, P-channel, depletion mode, parallel plate, junction, or any other form, or any combination of forms. Capacitor 13 is an optional part of trigger circuit TR.

In one embodiment, trigger circuit TR may be a simple conductor between first voltage supply Vdd and at least one of the gates of field-effect devices 14a and 16.

Loading circuit 14a, 14b may include either or both P-channel load field-effect transistor 14a and capacitor 14b.

The source-drain path of optional P-channel load field-effect device 14a is connected at one end to output node OUT and at the other end to first voltage supply Vdd. The gate or control electrode of optional load transistor 14a is connected to internal node N. The channel of load transistor 14a may have a width-to-length ratio of approximately 20-to-1. The channel length of this device 14a is ideally the minimum used for fabrication of the entire integrated circuit.

Capacitor 14b is illustrated as a P-channel field-effect transistor with source and drain connected to first voltage supply Vdd and with gate or control electrode connected to output terminal OUT. The area of the channel of capacitor 14b may be approximately twice the area of capacitor 13. Capacitor 14b may be implemented in any form, including N-channel, P-channel, depletion mode, parallel plate, junction, or any other form, or any combination of forms.

Either the load device 14a or capacitor 14b may be removed from the circuit. Removing capacitor 14b could improve immunity to Vdd noise.

The source-drain path of optional feedback field-effect device 15 is connected at one end to first voltage supply Vdd and at the other end to internal node N. The gate or control electrode of feedback device 15 is connected to output node OUT. The channel of P-channel feedback transistor 15 may have a width-to-length ratio of approximately 3-to-2.

The source-drain path of N-channel detector field-effect device 16 is connected between the output terminal OUT and second voltage supply Vss. The gate or control electrode of detector device 16 is connected to internal node N and the channel of detector transistor 16 may have a width-to-length ratio of approximately 3-to-2.

On power-up, capacitor 14b causes the voltage at the output terminal OUT to increase with first supply voltage Vdd while optional capacitor 13 causes the voltage at internal node N to remain at the value of second voltage supply Vss, resulting in an increasing power-up signal at the output. If the power-up transient is slow, pull-down device 12 and optional load device 14a assist by providing some subthreshold leakage onto internal node N and output node OUT.

When the first voltage supply Vdd reaches one P-channel Vt (Vtp), the optional P-channel load transistor 14a turns on and holds the voltage at output node OUT at Vdd as Vdd rises. The voltage at output node OUT increases with Vdd until the voltage reaches 2 P-channel Vt's (with the metal options as shown on the schematic, bypassing the top P-channel transistor 10), then the pull-up string turns on and pulls the internal node N to Vdd-Vtp. If the N-channel Vt (Vtn) is less than or equal to the P-channel Vt, this begins to turn on the N-channel output detector transistor 16. If the N-channel Vt is greater than the P-channel Vt, then the output detector transistor 16 does not turn on until Vdd reaches Vtn+Vtp (Vdd−Vtp=Vtn).

Once the output detector transistor 16 turns on, the voltage at output terminal OUT goes low, indicating that Vdd has reached a proper level to activate all other circuits. When the output is low, the P-channel feedback device 15 turns on to pull the internal node to a full Vdd, recovering the Vtp loss and eliminating the static current drain that would otherwise occur in the output stage.

The basic principles used to design the circuit herein are (1) neither the Vdd detector nor the optional feedback path comprising device 15 should contain any node that is part of a linear circuit (static pull-up path and static pull-down path both on the at same time) or part of a static logic circuit (static pull-up path and static pull-down path both connected to the node, but may be on at different times); and (2) device channel lengths are chosen to be long or short to control subthreshold currents.

It should be noted that the optional feedback path consists of a single P-channel device 15. The Vdd detector uses a capacitor 13 as a dynamic pull-down, assisted by a grounded-gate, short-channel device that drains off an amount of current that is normally insignificant. It uses a static pull-up chain of devices 10 that are ordinary other than the use of longer channel lengths to reduce the subthreshold conduction of the chain.

It should also be noted that if all of the pull-up devices 10 and 11 are removed from the detector circuit, then the internal node N will be connected to first voltage supply Vdd. If that is the case, then N-channel capacitor 13, the grounded-gate N-channel transistor 12, and feedback device 15 may be removed from the circuit without adversely affecting operation. In this embodiment the triggering threshold Vtr is Vtn.

The channel width-to-length ratio of load transistor 14a should be chosen to be larger than the channel width-to-length ratio of said detector transistor 16 such that said load transistor 14a has significantly more subthreshold current than the detector transistor 16 during the initial part of the power-up transient, when the voltage difference between said first and second voltage supplies is small. If the circuit comprises only transistors 14a and 16, then the difference in subthreshold currents between transistors 14a and 16 must be sufficient to drive the capacitance of any circuit attached to output terminal OUT during a rapid power-up.

As is well-known, any of the various embodiments of the circuit may be converted into a complementary circuit by replacing all P-channel devices with N-channel devices, all N-channel devices with P-channel devices; all Vdd drain, gate, and source connections being made to ground; all ground connections to drains, gates, and sources being made to Vdd (substrate connections are understood). The conversion may require some device sizes to be changed to allow for the different device parameters. The resulting circuits would work exactly the same way, except that all the wave forms in the complementary circuits would be inverted.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method for generating a power-up pulse using a circuit with a detector field-effect device having ON and OFF states, said detector field-effect device conducting a subthreshold current while in said OFF state, said method comprising:

using said subthreshold current of said detector field-effect device while in said OFF state to cause an output of said circuit to be at a first voltage level, using said detector field-effect device while in said ON state to cause said output of said circuit to be at a second voltage level.

2. The method of claim 1, said detector device including a channel length, wherein said channel length of said detector device is preselected to control said subthreshold current.

3. The method of claim 1, said circuit including a triggering sub-circuit with an output, said detector field-effect device including a source-drain path and a gate; wherein said source-drain path of said detector device is connected between said output of said circuit and a voltage supply and wherein said gate of said detector device is connected to said output of said triggering sub-circuit.

4. The method of claim 1, said circuit including a triggering field-effect device having a source-drain path and a gate and said detector device including a gate; wherein said source-drain path of said triggering device is connected between a first voltage supply and gate of said detector device and wherein said gate of said triggering device is connected to one of a first voltage supply or a second voltage supply.

5. The method of claim 4, said triggering device includes a channel length to control subthreshold current, wherein said channel length of said triggering device is preselected to control said subthreshold current of said triggering device.

6. The method of claim 4, said detector field-effect device including a source-drain path and a gate and said circuit including a triggering sub-circuit having an output; wherein said source-drain path of said detector device is connected between said output of said circuit and a voltage supply and wherein said gate of said detector device is connected to said output of said triggering sub-circuit.

7. The method of claim 1, wherein said circuit includes a loading means and wherein said loading means further includes at least a first capacitor connected between a voltage supply and said output of said circuit.

8. The method of claim 1, wherein said circuit includes a loading means and wherein said loading means further includes at least a first field-effect-type capacitor connected between a voltage supply and said output of said circuit.

9. The method of claim 1, said circuit including at least one diode-connected field-effect device having a source-drain path and said detector device including a gate, wherein said source-drain path of said diode-connected field-effect device is connected between a voltage supply and said gate of said detector device.

10. The method of claim 1, said circuit including a pull-down field-effect device having a source-drain path and a gate and said detector device including a gate, wherein said gate of said pull-down device is connected to one of a first voltage supply or a second voltage supply and wherein said source-drain path of said pull-down device is connected between said gate of said detector device and said second voltage supply.

11. The method of claim 1, said circuit including a pull-down field-effect device having a source-drain path, a gate and a channel length and said detector device including a gate; wherein said gate of said pull-down device is connected to one of a first voltage supply or a second voltage supply, wherein said source-drain path of said pull-down device is connected between said gate of said detector device and said second voltage supply, and wherein said channel length of said pull-down device is shorter than said channel length of said detector device.

12. The method of claim 1, said circuit including a feedback field-effect device having a source-drain path and a gate and said detector device including a gate, wherein said source-drain path of said feedback device is connected between said gate of said detector device and one of a first voltage supply or a second voltage supply and wherein said gate of said feedback device is connected to said output of said circuit.

13. The method for forming a power-up pulse generating circuit including a first field-effect device having a source-drain path, a gate and a channel length and including a second field-effect device having a source-drain path, a gate and a channel length; said source-drain path of said first device connected between a first voltage source and an output of said circuit; said source-drain path of said second device connected between said output of said circuit and a second voltage source, said gates of said first and second field devices connected to an internal node of said circuit, said method comprising:
forming said channel length of said second field-effect device to be longer than said channel length of said first field-effect device.

14. The method of claim 13, wherein said channel length of said second field-effect device is at least 50 percent longer than said channel length of said first field-effect device.

15. The method of claim 13, said circuit including a capacitance connected in parallel with said source-drain path of said first field-effect device.

16. A method for forming a power-up pulse generating circuit using technology allowing a minimum-field-effect-device channel length, said circuit including a capacitance and including a detector field-effect device having a source-drain path, a gate and a channel length; said capacitance connected between a first voltage source and an output of said circuit; said source-drain path of said detector device connected between said output of said circuit and a second voltage source, said gate of said detector device connected to a triggering signal, said method comprising:
forming said channel length of said detector field-effect device to be longer than said minimum-field-effect-device channel length.

17. The method of claim 16, wherein said channel length of said detector field-effect device is at least 50 percent longer than said minimum-field-effect-device channel length.

18. The method of claim 16, said circuit including a load field-effect device having a source-drain path and a gate, wherein said source-drain path of said load field-effect device is connected in parallel with said capacitance and wherein said gate of said load field-effect device is coupled to said gate of said detector device.

19. The method of claim 16, said circuit including a load field-effect device having a source-drain path, a gate and a channel length; wherein said source-drain path of said load field-effect device is connected in parallel with said capacitance, wherein said gate of said load field-effect device is coupled to said gate of said detector device, and wherein said channel length of said load field-effect is shorter than said channel length of said detector device.

* * * * *